(12) United States Patent
Jette

(10) Patent No.: US 10,225,947 B2
(45) Date of Patent: Mar. 5, 2019

(54) CABLE MANAGEMENT SYSTEM

(71) Applicant: Cable Management Solutions Inc., Bayshore, NY (US)

(72) Inventor: Roger Jette, East Islip, NY (US)

(73) Assignee: Cable Management Solutions Inc., Bayshore, NY (US)

( * ) Notice: Subject to any disclaimer, the term of this patent is extended or adjusted under 35 U.S.C. 154(b) by 0 days.

(21) Appl. No.: 15/959,523

(22) Filed: Apr. 23, 2018

(65) Prior Publication Data

US 2018/0317336 A1 Nov. 1, 2018

Related U.S. Application Data

(60) Provisional application No. 62/491,713, filed on Apr. 28, 2017.

(51) Int. Cl.
| | |
|---|---|
| *H02B 1/01* | (2006.01) |
| *H05K 7/14* | (2006.01) |
| *G06F 1/18* | (2006.01) |
| *G06F 1/16* | (2006.01) |
| *H02G 3/04* | (2006.01) |
| *H02G 3/00* | (2006.01) |

(52) U.S. Cl.
CPC ......... *H05K 7/1491* (2013.01); *G06F 1/1683* (2013.01); *G06F 1/189* (2013.01); *H02G 3/0443* (2013.01); *H02G 3/263* (2013.01)

(58) Field of Classification Search
CPC ...... H05K 7/1491; G06F 1/1683; G06F 1/189
USPC .................................................. 361/825–826
See application file for complete search history.

(56) References Cited

U.S. PATENT DOCUMENTS

| | | | |
|---|---|---|---|
| 5,893,539 A | 4/1999 | Tran et al. | |
| 5,957,416 A * | 9/1999 | Sellati ...................... | H02G 3/26 248/58 |
| 6,364,255 B1 * | 4/2002 | Carrick ..................... | F16L 3/26 248/49 |

(Continued)

FOREIGN PATENT DOCUMENTS

EP 1070894 A2 1/2001

OTHER PUBLICATIONS

European Search Report and Written Opinion issued in corresponding application No. 18169313 dated Sep. 12, 2018, 6 pages.

*Primary Examiner* — Hung S. Bui
(74) *Attorney, Agent, or Firm* — Carter, DeLuca, Farrell & Schmidt, LLP

(57) ABSTRACT

A cable support apparatus includes a flexible spine and a plurality of support members disposed along a length of the flexible spine. Each support member includes an attachment portion and a body portion. The attachment portion is secured to the flexible spine in at least two locations and cooperates therewith to define a first slot oriented in a first direction and a second slot oriented in a second direction perpendicular to the first direction. The body portion depends from the attachment portion, defines an interior, and includes an opening providing access to the interior. The opening is configured to permit passage of at least one cable therethrough and into the interior. The interiors of the body portions of the plurality of support members cooperate to define a longitudinal passageway extending along the flexible spine in parallel orientation relative to the flexible spine.

17 Claims, 6 Drawing Sheets

(56) References Cited

U.S. PATENT DOCUMENTS

| 8,783,628 B2* | 7/2014 | Jette | H02G 3/0443 |
| | | | 248/60 |
| 8,985,530 B2* | 3/2015 | Jette | H02G 3/0443 |
| | | | 248/49 |
| 2001/0007341 A1 | 7/2001 | Jette | |
| 2012/0175470 A1 | 7/2012 | Jette | |

* cited by examiner

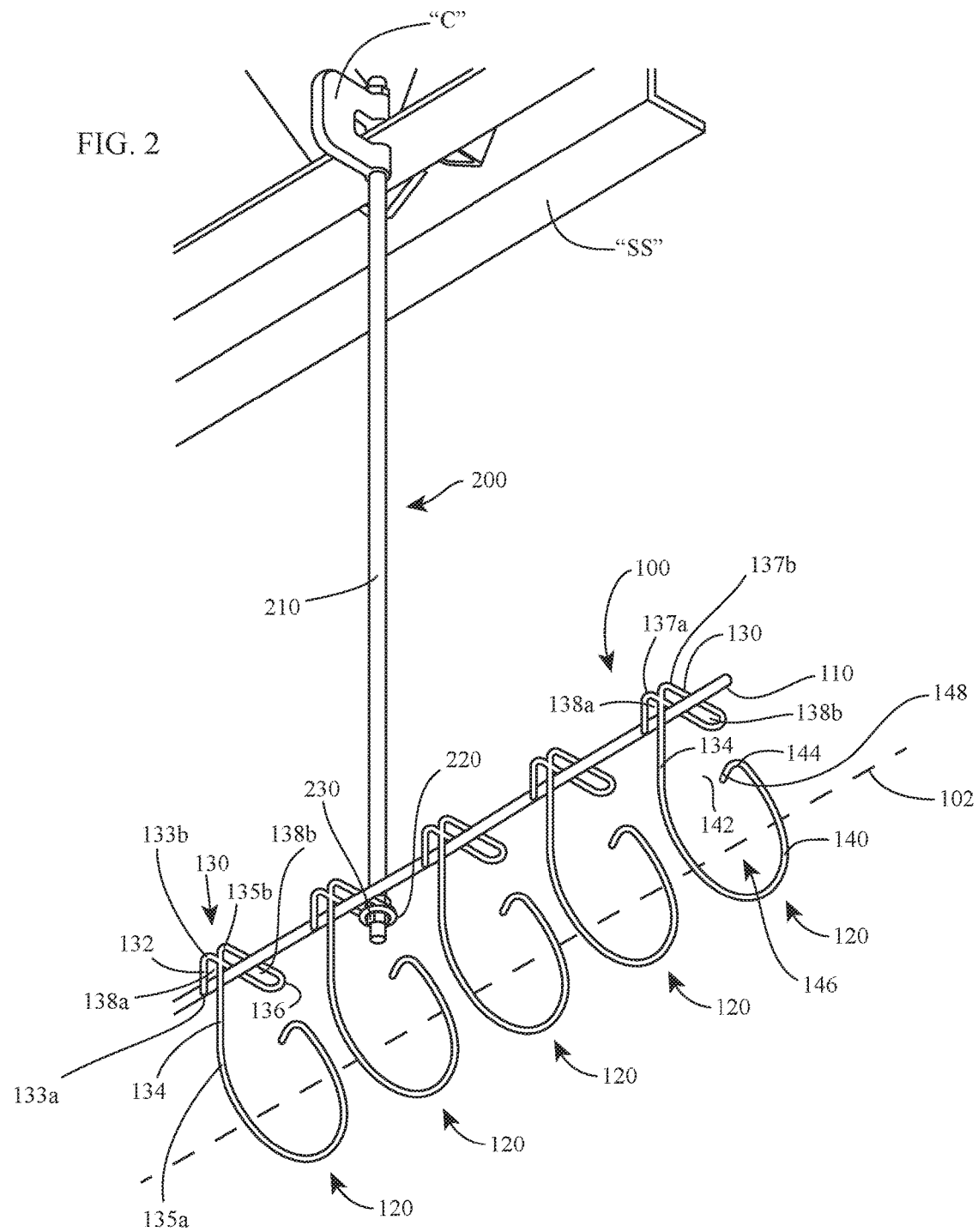

CABLE MANAGEMENT SYSTEM

CROSS-REFERENCE TO RELATED APPLICATIONS

This application claims the benefit of U.S. Provisional Patent Application No. 62/491,713, titled "Cable Management System" and filed on Apr. 28, 2017, the entire contents of which is hereby incorporated herein by reference.

BACKGROUND

Technical Field

The present disclosure relates to cable management and, more particularly, to a flexible cable management system for supporting and retaining cables therein.

Description of Related Art

Due to the increasing usage of communication, data, and other cable-dependent systems, greater numbers of cables are required to interconnect various systems with one another and with various peripheral devices. As a result, cable management systems have been developed to deal with the task of organizing and routing cables to their destinations. As can be appreciated, these cable management systems must be capable of securely retaining one or more cables and routing the cables around fixed obstacles, e.g., ductwork, walls, beams, fixtures, etc. Further, since buildings define vastly different, and sometimes unique, configurations, it is desirable that any cable management systems be adaptable for use in various settings.

While cable management systems for retaining cables are generally known, such cable management systems are presently incapable of adequately retaining cables therein regardless of the bend(s) and/or orientation(s) of the system.

SUMMARY

To the extent consistent, any of the aspects detailed herein may be used in conjunction with any or all of the other aspects detailed herein.

A cable support apparatus provided in accordance with aspects of the present disclosure includes a flexible spine and a plurality of support members. The flexible spine is formed from a single piece of material. The support members are disposed along a length of the flexible spine. Each support member is formed from a single piece of material and includes an attachment portion and a body portion. The attachment portion of each support member is secured to the flexible spine in at least two locations. Further, the attachment portion of each support member and the flexible spine cooperate to define a first slot oriented in a first direction and a second slot oriented in a second direction. The second direction is oriented perpendicularly relative to the first direction. The body portion of each support member of the cable support apparatus depends from the attachment portion thereof. Each body portion defines an interior and includes an opening providing access to the interior. The opening is configured to permit passage of at least one cable therethrough and into the interior. The interiors of the body portions of the support members cooperate to define a longitudinal passageway extending along the flexible spine in parallel orientation relative thereto.

In aspects of the present disclosure, the flexible spine defines a longitudinal axis extending in a third direction, and the first and second directions are each oriented perpendicularly relative to the third direction.

In aspects of the present disclosure, the cable support apparatus further includes a first mounting member configured for receipt within the first slot of one of the plurality of support members. The first mounting member may be a punch mount or a threaded mount. Further, the first mounting member may be affixed to the attachment portion and may extend through the first slot of the support member thereof.

In aspects of the present disclosure, the cable support apparatus includes a second mounting member configured for receipt within the second slot of one of the plurality of support members. The second mounting member may be a punch mount.

In aspect of the present disclosure, the body portion of each support member defines a radiused configuration.

In aspects of the present disclosure, the body portion of each support member defines a free end having an inwardly-angled flange extending therefrom. The flange is configured to facilitate both insertion of a cable through the opening of the support member and into the interior thereof and retention of a cable within the interior of the support member.

Another cable support apparatus provided in accordance with aspects of the present disclosure includes a flexible spine formed from a single piece of material and a plurality of support members disposed along a length of the flexible spine. Each support member is formed from a single piece of material and includes an attachment portion and a radiused body portion. The attachment portion is secured to the flexible spine and cooperates with the flexible spine to define at least one attachment slot. The radiused body portion depends from the attachment portion and defines an interior. The radiused body portion includes a fixed end attached to the attachment portion and a free end. The free end is spaced-apart from the fixed end to define an opening therebetween providing access to the interior. The free end including a flange extending therefrom. The flange is angled inwardly into the interior and configured to guide insertion of cables through the opening and into the interior and to inhibit cables from exiting the interior through the opening. The interiors of the body portions of the plurality of support members cooperate to define a longitudinal passageway extending along the flexible spine in parallel orientation relative to the flexible spine.

In aspects of the present disclosure, each radiused body portion is configured to permit insertion of cables into the interior thereof while the cables are maintained in parallel orientation relative to the flexible spine. Further, the radiused body portions of at least two of the support members may be configured to permit simultaneous insertion of cables into the interiors thereof while the cables are maintained in parallel orientation relative to the flexible spine.

In aspects of the present disclosure, the radiused body portions of the support members each define greater than a semicircle but less than a full circle. Additionally or alternatively, the radiused body portions of the support members may be helical.

In aspects of the present disclosure, the attachment portion of each of the plurality of support members is secured to the flexible spine in at least two locations.

In aspects of the present disclosure, the attachment portion of each of the plurality of support members and the flexible spine cooperate to define a first slot oriented in a first direction and a second slot oriented in a second direction perpendicular to the first direction.

In aspects of the present disclosure, the first slot enables attachment of the cable support apparatus to a structure in a first orientation and the second slot enables attachment of the cable support apparatus to a structure in a second orientation perpendicular to the first orientation.

BRIEF DESCRIPTION OF THE DRAWINGS

Various aspects and features of the present disclosure are described herein with reference to the drawings, wherein like reference numerals identify similar or identical elements and:

FIG. 2 is an enlarged, perspective view of the area of detail indicated as "2" in FIG. 1;

DETAILED DESCRIPTION

Figure 1:
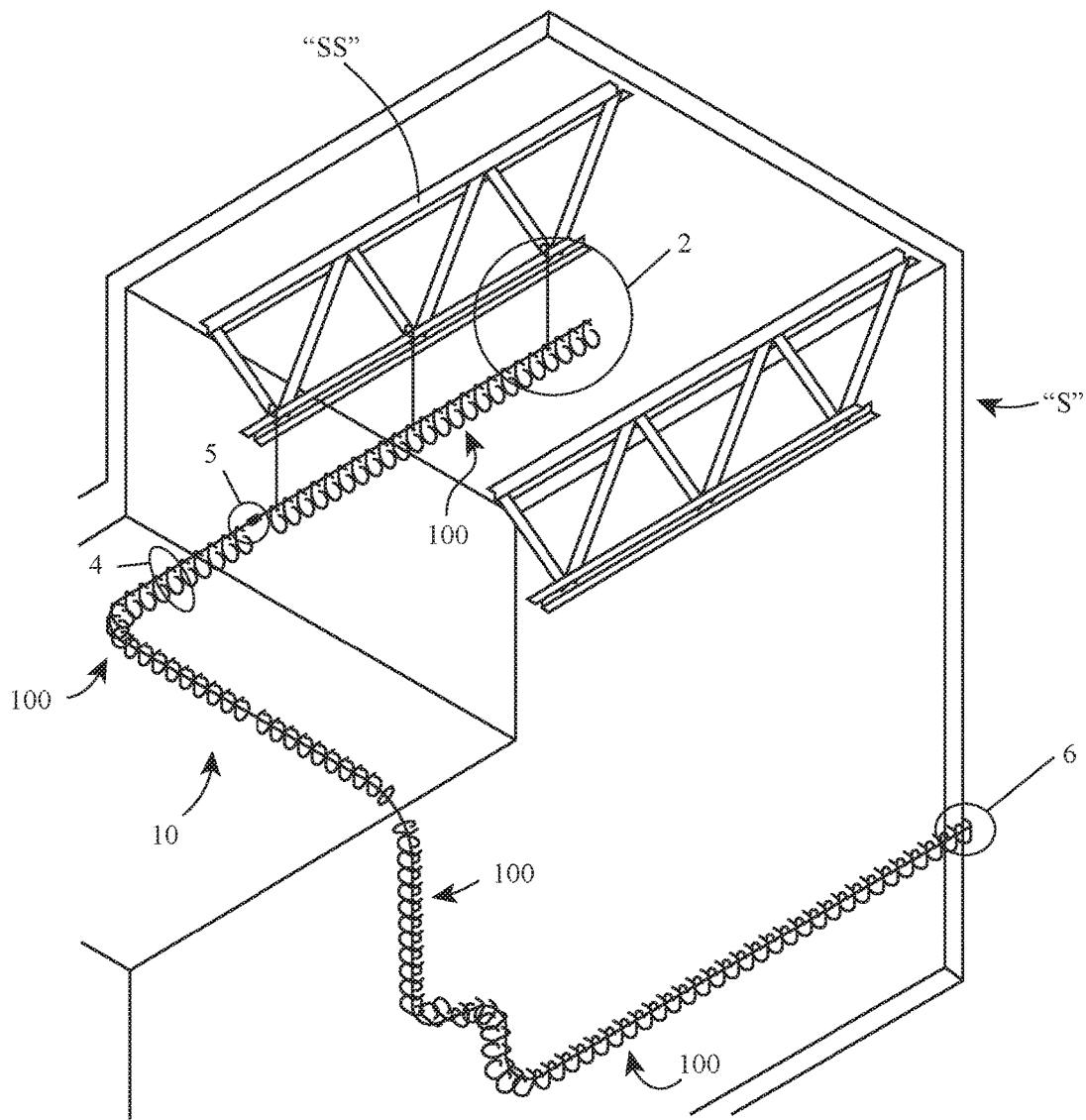
FIG. 1 is a perspective view of a cable support system provided in accordance with the present disclosure, mounted on a structure.

Turning now to FIG. 1, a cable support system provided in accordance with the present disclosure is shown generally identified by reference numeral 10. Cable support system 10 includes a plurality of cable support apparatuses 100, one or more vertically-oriented threaded mounts 200 (FIG. 2), one or more vertically-oriented punch mounts 300 (FIG. 4), one or more coupling sleeves 400 (FIG. 5), and one or more horizontally-oriented punch mounts 500 (FIG. 6).

Cable support apparatuses 100 of cable support system 10 are sufficiently strong to retain their formed shape despite typical forces, stresses, and vibrations acting thereon. However, cable support apparatuses 100 are also sufficiently pliable such that a user may bend and/or manipulate cable support apparatuses 100 in any direction and in numerous positions along the length thereof without the use of tools or machinery. Rather, in order to form a cable support apparatus 100 to a desired configuration, the user need only grasp the flexible spine 110 thereof on opposing sides of the desired bend point and manipulate the flexible spine 110 to the desired configuration, with cable support apparatus 100 thereafter retaining its formed configuration. The above process can then be repeated at each desired bend point such that each cable support apparatus achieves a desired configuration.

Adjacent cable support apparatuses 100 of cable support system 10 are coupled to one another, in an end-to-end relationship, via a coupling sleeve 400 (FIG. 5), such that cable support system 10 may define a desired length in addition to a desired configuration. Thus, cable support system 10 may define a multi-curved, three-dimensional, and/or other complex shape configuration such as, for example, to enable cable support apparatus 10 to snake along and conform with the various features of structure "S." Further, the various attachment features of cable support system 10 enable attachment to various different features of a structure, e.g., structure "S." More specifically, the one or more vertically-oriented threaded mounts 200 (FIG. 2) of cable support system 10 enable suspension of cable support system 10 from a support structure "SS" of structure "S," the one or more vertically-oriented punch mounts 300 (FIG. 4) enable attachment of cable support system 10 to a horizontally-oriented surface, and the one or more horizontally-oriented punch mounts 500 (FIG. 6) enable attachment of cable support system 10 to a vertically-oriented surface.

Referring also to FIG. 2, each cable support apparatus 100 is substantially similar, except that each cable support apparatus 100 may be cut to a desired length, such that a cable support system 10 having a specific configuration can be achieved. The cable support apparatuses 100 being substantially similar, reference hereinbelow to cable support apparatus 100 in the singular is understood to apply to each cable support apparatus 100.

Cable support apparatus 100 is configured to receive and retain a plurality of cables (not shown) within a longitudinal passageway 102 defined therethrough, and includes a flexible spine 110 and a plurality of support members 120 spaced-apart along the length of, engaged to, and extending from flexible spine 110 to define longitudinal passageway 102 extending along the length of flexible spine 110.

Flexible spine 110 is formed from a single piece of wire stock (or other suitable material) and, as noted above, is formable to define and maintain a desired configuration of cable support apparatus 100. Each support member 120 is also formed from a single piece of wire stock (or other suitable material), although other configurations are also contemplated. Forming flexible spine 110 and each support member 120 from a single piece of material, e.g., wire stock, decreases the complexity and cost of manufacture of cable support apparatus 100 and facilitates installation thereof.

With additional reference to FIGS. 3A and 3B, support members 120 of cable support apparatus 100 are substantially similar (except as noted herein) and, thus, reference hereinbelow is made in the singular to one support member 120 and is understood to apply to each support member 120.

Support member 120 includes an attachment portion 130 and a body portion 140 depending from attachment portion 130. Attachment portion 130 is attached, e.g., welded, to flexible spine 110 and is configured to enable suspension of cable support apparatus 100 from a support structure "SS," attachment of cable support apparatus 100 to a horizontally-oriented surface, and/or attachment of cable support system 10 to a vertically-oriented surface, as detailed below.

Attachment portion 130 of support member 120, more specifically, includes first and second spaced-apart upright segments 132, 134 interconnected by a U-shaped segment 136. First and second spaced-apart upright segments 132, 134 are each welded, or otherwise attached, to flexible spine 110 and extend in perpendicular orientation relative thereto. Providing these two attachment points, at different longitudinal positions along flexible spine 110, adds structural support and stability, inhibiting twisting of support member 120 relative to flexible spine 110.

First upright segment 132 of attachment portion 130, in particular, includes a free end 133a extending below flexible spine 110 (from the orientation illustrated in FIG. 3A) and a fixed end 133b extending above flexible spine 110 (from the orientation illustrated in FIG. 3A) and is attached to flexible spine 110 between the free and fixed ends 133a, 133b, respectively, thereof. A first end 137a of U-shaped segment 136 extends from fixed end 133b of first upright segment 132 in perpendicular orientation relative to both attachment portion 130 and flexible spine 110.

Second upright segment 134 of attachment portion 130, in particular, includes a first fixed end 135a extending below flexible spine 110 (from the orientation illustrated in FIG.

3A) and a second fixed end 135b extending above flexible spine 110 (from the orientation illustrated in FIG. 3A) and is attached to flexible spine 110 between the free and fixed ends 135a, 135b, respectively, thereof. Second upright segment 134 defines an elongated configuration as compared to first upright segment 132 in that first fixed end 135a of second upright segment 134 extends further below flexible spine 110 as compared to free end 133a of first upright segment 132. Body portion 140 of support member 120 extends from first fixed end 135a of second upright segment 134 and, due to the elongated configuration of second upright segment, is disposed below flexible spine 110. A second end 137b of U-shaped segment 136 extends from second fixed end 135b of second upright segment 134 in perpendicular orientation relative to both attachment portion 130 and flexible spine 110 (from the orientation illustrated in FIG. 3A).

First and second spaced-apart upright segments 132, 134 define a first slot 138a, between flexible spine 110 and U-shaped segment 136. First slot 138a enables receipt of a horizontal attachment component, e.g., horizontally-oriented punch mount 500 (FIG. 6), to, for example, attach cable support apparatus 100 to a vertically-oriented surface.

U-shaped segment 136, as mentioned above, is attached at its first and second ends 137a, 137b to fixed ends 133b, 135b of first and second upright segments 132, 134, respectively, and is disposed in perpendicular orientation relative to attachment portion 130 and flexible spine 110. As a result of this configuration, U-shaped segment 136 defines a second slot 138b, between the closed end of U-shaped segment 136 and first and second spaced-apart uprights segments 132, 134, and oriented perpendicular to first slot 138a. Second slot 138b enables receipt of a vertical attachment component, e.g., a vertically-oriented threaded mount 200 (FIG. 2) or a vertically-oriented punch mount 300 (FIG. 4), to, for example, suspend cable support apparatus 100 from a support structure "SS" or attach cable support apparatus 100 to a horizontally-oriented surface.

With attachment portion 130 of support member 120 defining first and second slots 138a, 138b oriented perpendicularly relative to one another, versatility is provided in enabling suspension from a support structure "SS," attachment to a horizontally-oriented surface, or attachment to a vertically-oriented surface. As detailed below, various attachment components, e.g., vertically-oriented threaded mounts 200 (FIG. 2), vertically-oriented punch mounts 300 (FIG. 4), and horizontally-oriented punch mounts 500 (FIG. 6), integral with or attachable to attachment portion 130, may cooperate with first slot 138a or second slot 138b to enable various different attachments of cable support apparatus 100 to a structure, e.g., structure "S."

Body portion 140 of support member 120, as noted above, depends from attachment portion 130. Body portion 140, more specifically, extends from first fixed end 135a of elongated second upright segment 134 in a similar direction as U-shaped segment 136 extends from second fixed end 135b of elongated second upright segment 134. Body portion 140 is radiused and extends beyond a semi-circle configuration but does not define a complete circle; instead body portion 140 defines an opening 142 between a free end 144 of body portion 140 and elongated second upright segment 134 of attachment portion 130. Opening 142 provides access to the generally circular-shaped interior 146 of body portion 140. Body portion 140 further includes a flange 148 extending from free end 144 thereof. Flange 148 is angled off the curvature path of body portion 140 inwardly into the interior 146 of body portion 140. As detailed below, flange 148 serves as both a guide to facilitate insertion of cables through opening 142 and into the generally circular-shaped interior 146 of body portion 140 and a stop to inhibit cables from falling out of the generally circular-shaped interior 146 of body portion 140 via opening 142.

Figure 3A:
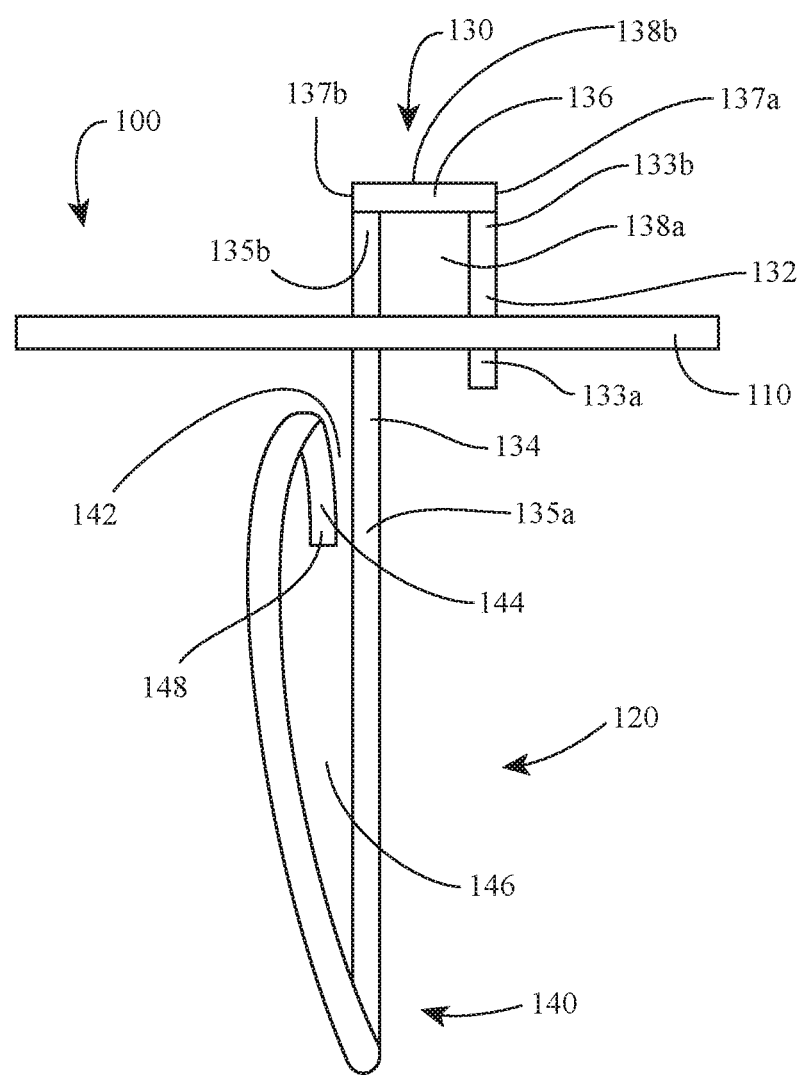
FIG. 3A is a side view of a support member of a cable support apparatus of the cable support system of FIG. 1.

Body portion 140, as best illustrated in FIG. 3A, defines a non-planar configuration in that body portion 140 is helical. As a result of this configuration, free end 144 of body portion 140 is longitudinally offset, along flexible spine 110, relative to second upright segment 134 of attachment portion 130. However, body portion 140 defines a relatively small pitch such that free end 144 of body portion 140 is longitudinally offset a relatively small distance from second upright segment 134.

Support members 120 may be dimensioned such that the generally circular-shaped interiors 146 of body portions 140 are configured to receive a pre-determined maximum number of cables. Due to the generally circular-shaped interiors 146 of body portions 140, over-filling of support members 120 is inhibited, thus helping to ensure that the maximum number of cables is not exceeded. Such a configuration is advantageous, for example, in implementations where the cables produce heat such as with respect to power over Ethernet cables. By limiting the number of cables that can fit within the generally circular-shaped interiors 146 of body portions 140, the overall heat provided by the plurality of cables can be kept below a safe level, thus preventing fire. The particular dimensions of support members 120 may depend on the maximum number of cables and the diameter of the cables, for example.

Referring back to FIG. 2, as noted above, cable support apparatus 100 includes a flexible spine 110 and a plurality of spaced-apart support members 120 that define a longitudinal passageway 102 therethrough. The circular-shaped interiors 146 of the body portions 140 of the plurality of support members 120, more specifically, cooperate to define longitudinal passageway 102 which extends in generally parallel orientation relative to flexible spine 110. Longitudinal passageway 102, as detailed below, is configured to receive and retain a plurality of cables therein such that the cables likewise extend in generally parallel orientation relative to flexible spine 110.

Figure 3B:
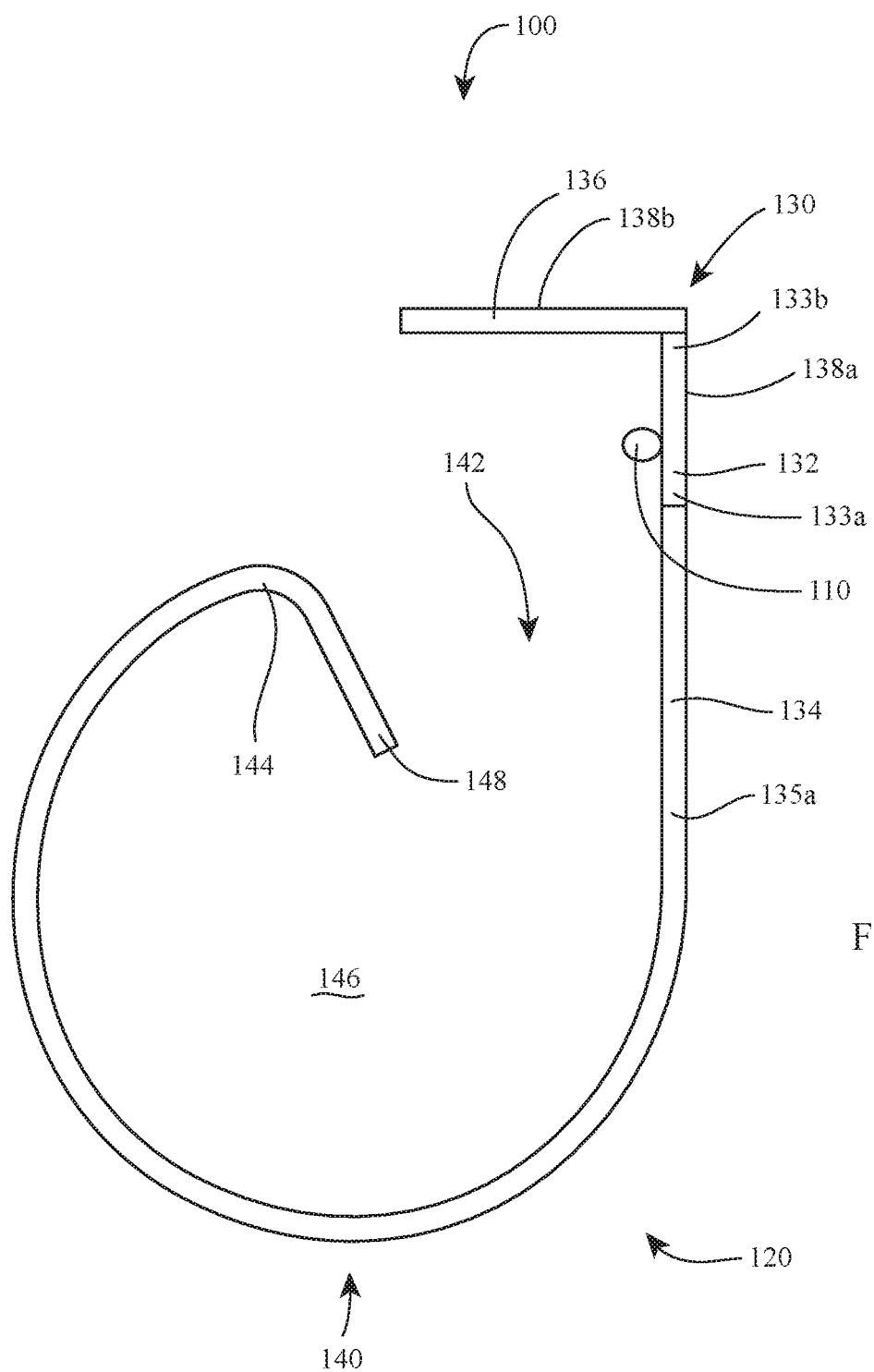
FIG. 3B is a front view of the support member of FIG. 3A.

With additional reference to FIGS. 3A and 3B, in order to position a plurality of cables within longitudinal passageway 102, the cables are moved towards the openings 142 of the body portions 140 of each support member 120 (collectively or several support members 120 at a time). As detailed above, body portions 140 of support members 120 each include a flange 148 angled inwardly into the interior 146 of the respective body portion 140. Thus, once the cables are positioned above the openings 142, the cables may be urged or dropped into openings 142 while positioned in generally parallel orientation relative to flexible spine 110. Once urged or dropped towards openings 142, flanges 148 guide the cables into the generally circular-shaped interiors 146 of body portions 140 of support members 120. This insertion may be referred to as "drop-in" or "single-direction" insertion in that multi-direction manipulation of the cables and/or movement of the cables out of parallel orientation relative to flexible spine 110 is not required in order to position the cables within longitudinal passageway 102. This configuration enables effective and efficient positioning of cables within longitudinal passageway 102. Further, this configuration enables the cables to be inserted into a plurality of support members 120 together with one another, rather than requiring separate manipulations of the cables to position the cables within each of the support members 120.

As detailed above, cable support apparatus 100 facilitates the positioning of a plurality of cables into the longitudinal passageway 102 thereof in an effective and efficient manner. In addition to providing relatively easy installation, cable support apparatus 100 also provides pipe-like functionality in that cable support apparatus 100 retains cables within longitudinal passageway 102 despite changes in orientation of cable support apparatus 100 and/or manipulation thereof. More specifically, the radiused configurations of body portions 140 of support members 120 of cable support apparatus 100 provide smooth, arcuate interior surfaces along which the cables may slide as cable support apparatus 100 (or a portion thereof) is manipulated to a desired orientation. Once the desired orientation is achieved, the cables may come to rest in the troughs of body portions 140. As can be appreciated, with body potion 140 being radiused, a trough is defined regardless of the orientation thereof. The inwardly-angled flanges 148 of body portion 140 of support members 120 provide additional retention functionality by inhibiting cables from sliding along the interiors of body portions 140 towards flanges 148 and out openings 142. U-shaped segments 136 of attachment portions 130 may function similarly at the other ends of body portions 140.

With reference to FIGS. 1 and 2, as noted above, cable support system 10 includes one or more vertically-oriented threaded mounts 200 configured to enable suspension of cable support system 10 from a support structure "SS" of structure "S." Each threaded mount 200 includes an elongated vertical rod 210 defining threads on at least a portion of the exterior thereof. An upper end portion of elongated vertical rod 210 is secured to support structure "SS" via a clamp "C" or other suitable mechanism. A lower end portion of vertical rod 210 is coupled to the attachment portion 130 of one of the support members 120 of cable support apparatus 100. More specifically, the lower end portion of vertical rod 210 extends through second slot 138b of the U-shaped segment 136 of the attachment portion 130 of the support member 120. A washer 220 is disposed about vertical rod 210 below U-shaped segment 136 of attachment portion 130 and a threaded nut 230 below that. Threaded nut 230, more specifically, is threadingly engaged about the threaded portion of vertical rod 210. Washer 220 defines a diameter greater than a width of the second slot 138b of the U-shaped segment 136 such that the attachment portion 130 is supported atop washer 220 and threaded nut 230, thus suspending cable support apparatus 100 from support structure "SS." In embodiments, a washer 220 is pre-installed (via welding the washer 220, for example) to the underside of the U-shaped segment 136 of the attachment portion 130 of one or more of the support members 120 of each cable support apparatus 100, e.g., at fixed intervals, such that each cable support apparatus 100 readily enables suspension from a support structure "SS" using one or more threaded mounts 200. Alternatively, washer 220 may be separate, thus enabling use of threaded mount(s) 200 with any one or more of the support members 120 of cable support apparatus 100.

Figure 4:
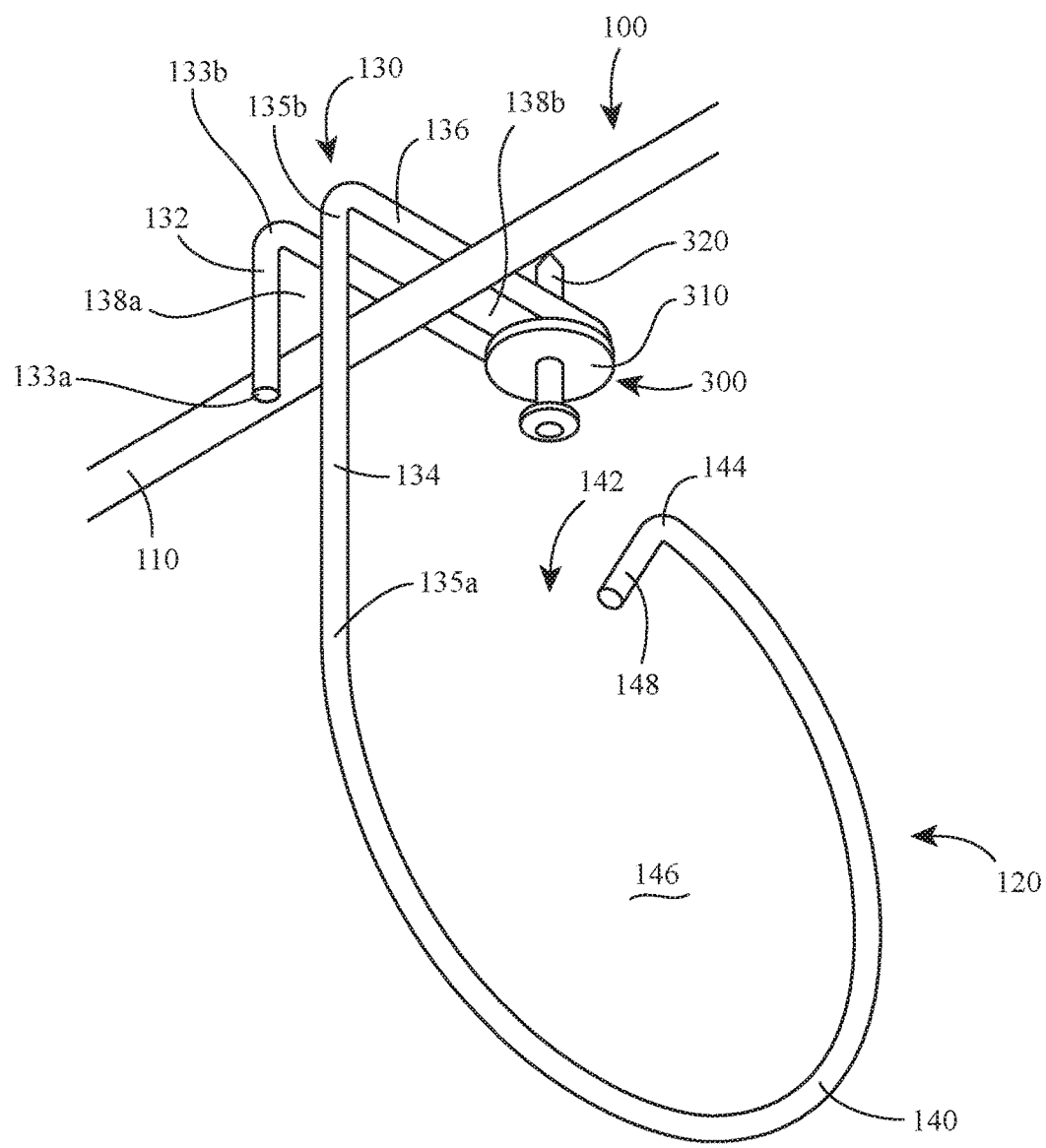
FIG. 4 is an enlarged, perspective view of the area of detail indicated as "4" in FIG. 1.

Referring to FIG. 4, as noted above, cable support system 10 includes one or more vertically-oriented punch mounts 300 configured to enable attachment of cable support system 10 to a horizontally-oriented surface. Each vertically-oriented punch mount 300 includes a washer 310 having a fastener 320, e.g., a nail, operably supported therein. Each vertically-oriented punch mount 300 is configured to interface with a pole gun, nail gun, or other suitable automatic device, to readily enable driving the fastener 320 into a horizontally-oriented surface. Washer 310 is disposed on an underside of the U-shaped segment 136 of the attachment portion 130 of the corresponding support member 120 with fastener 320 extending through second slot 138b thereof. Fastener 320 includes a head defining a diameter greater than the diameter of the aperture defined through washer 310 and washer 310, in turn, defines a diameter greater than a width of second slot 138b such that washer 310 and the head of fastener 320 maintain support member 120 in abutting relation relative to the horizontally-oriented surface once fastener 320 is driven into engagement therewith. In embodiments, a vertically-oriented punch mount 300 is pre-installed (via welding the washer 310 thereof to the underside of the U-shaped segment 136 of the attachment portion 130 with fastener 320 extending through the second slot 138b thereof, for example,) on one or more of the support members 120 of each cable support apparatus 100, such that each cable support apparatus 100 readily enables attachment to a horizontally-oriented surface. In such embodiments, vertically-oriented punch mounts 300 may be disposed at fixed intervals, e.g., every fourth support member 120, every fifth support member 120, etc. Alternatively, vertically-oriented punch mounts 300 may be separate and configured for engagement with any one or more of the support members 120 of cable support apparatus 100.

Figure 5:
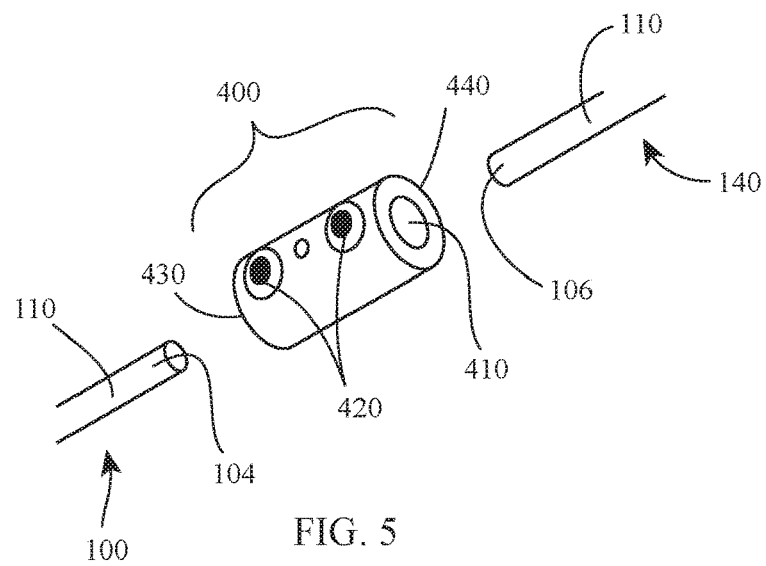
FIG. 5 is an enlarged, perspective view of the area of detail indicated as "5" in FIG. 1.
Figure 6:
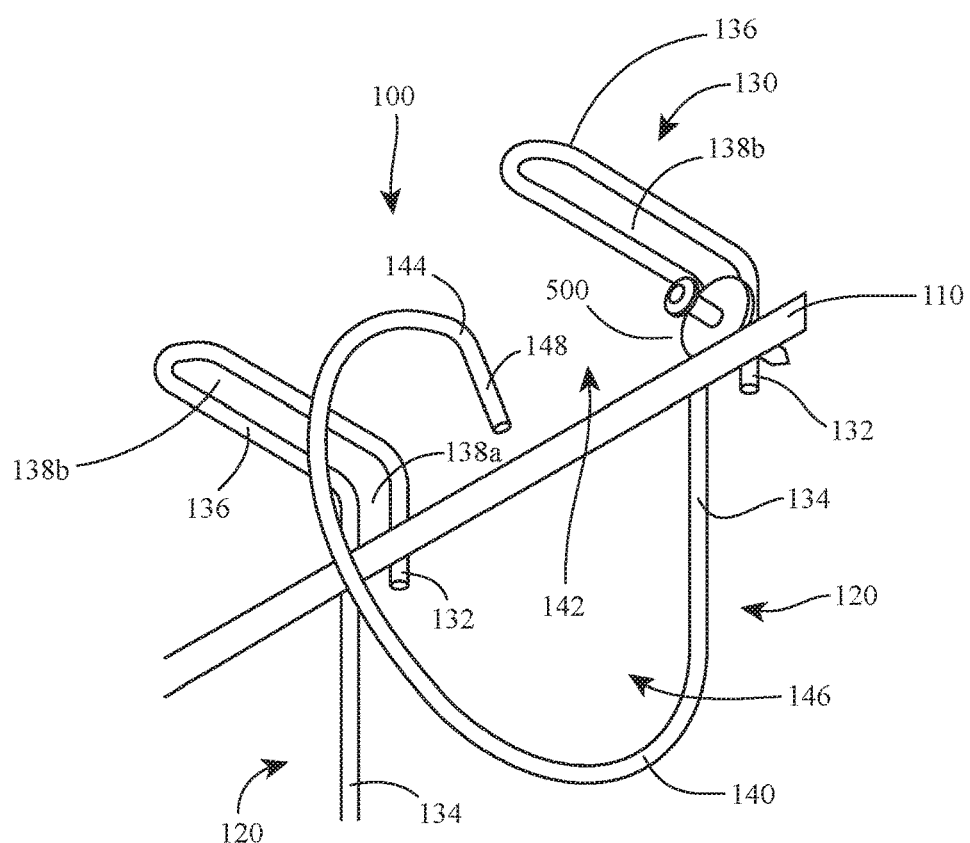
FIG. 6 is an enlarged, perspective view of the area of detail indicated as "6" in FIG. 1.

Turning to FIGS. 1 and 5, each coupling sleeve 400 is configured for securing two cable support apparatuses 100 to one another in an end-to-end relationship. More specifically, each coupling sleeve 400 defines a tube-like configuration including a lumen 410 extending therethrough. A pair of tightening screws 420 are engaged within coupling sleeve 400 and extend into lumen 410. Tightening screws 420 may be advanced (or retracted) relative to lumen 410 to extend further thereinto or retract further therefrom. In order to couple first and second cable support apparatuses 100 to one another, a first end 104 of the flexible spine 110 of the first cable support apparatus 100 is inserted into a first end 430 of lumen 410 of coupling sleeve 400, while a second end 106 of the flexible spine 110 of the second cable support apparatus 100 is inserted into a second end 440 of lumen 410 of coupling sleeve 400. Thereafter, tightening screws 420 are tightened to securely engage the ends 104, 106 of the flexible spines 110 of the first and second cable support apparatuses 100 to one another via coupling sleeve 400. As can be appreciated, such a configuration permits efficient and secure coupling of multiple cable support apparatuses 100 to one another.

Referring to FIG. 6, as noted above, cable support system 10 includes one or more horizontally-oriented punch mounts 500 configured to enable attachment of cable support system 10 to a vertically-oriented surface. Horizontally-oriented punch mounts 500 are similar to vertically-oriented punch mounts 300 (FIG. 4) except that each horizontally-oriented punch mounts 500 is operably supported through the first slot 138a of the attachment portion 130 of one of the support members 120 of cable support apparatus 100. In embodiments, one or more horizontally-oriented punch mounts 500 are pre-installed on cable support apparatus 100, similarly as detailed above with respect to vertically-oriented punch mounts 300 (FIG. 4), or may be separate therefrom.

From the foregoing and with reference to the various figure drawings, those skilled in the art will appreciate that certain modifications can also be made to the present disclosure without departing from the scope of the same. While several embodiments of the disclosure have been shown in the drawings, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

What is claimed:

1. A cable support apparatus, comprising:
a flexible spine formed from a single piece of material; and
a plurality of support members disposed along a length of the flexible spine, each support member formed from a single piece of material and including:
an attachment portion secured to the flexible spine in at least two locations, wherein the attachment portion and the flexible spine cooperate to define a first slot oriented in a first direction and a second slot oriented in a second direction, the second direction oriented perpendicularly relative to the first direction; and
a body portion depending from the attachment portion, the body portion defining an interior and including an opening providing access to the interior, the opening configured to permit passage of at least one cable therethrough and into the interior,
wherein the interiors of the body portions of the plurality of support members cooperate to define a longitudinal passageway extending along the flexible spine in parallel orientation relative to the flexible spine.

2. The cable support apparatus according to claim 1, wherein the flexible spine defines a longitudinal axis extending in a third direction, and wherein the first and second directions are each oriented perpendicularly relative to the third direction.

3. The cable support apparatus according to claim 1, further comprising a first mounting member configured for receipt within the first slot of one of the plurality of support members.

4. The cable support apparatus according to claim 3, wherein the first mounting member is a punch mount.

5. The cable support apparatus according to claim 3, wherein the first mounting member is a threaded mount.

6. The cable support apparatus according to claim 3, wherein the first mounting member is affixed to the attachment portion and extends through the first slot of the one of the plurality of support members.

7. The cable support apparatus according to claim 3, further comprising a second mounting member configured for receipt within the second slot of one of the plurality of support members.

8. The cable support apparatus according to claim 7, wherein the second mounting member is a punch mount.

9. The cable support apparatus according to claim 1, wherein the body portion of each support member defines a radiused configuration.

10. The cable support apparatus according to claim 1, wherein the body portion of each support member defines a free end having an inwardly-angled flange extending therefrom, the flange configured to facilitate both insertion of a cable through the opening of the support member and into the interior thereof and retention of a cable within the interior of the support member.

11. A cable support apparatus, comprising:
a flexible spine formed from a single piece of material; and
a plurality of support members disposed along a length of the flexible spine, each support member formed from a single piece of material and including:
an attachment portion secured to the flexible spine, the attachment portion cooperating with the flexible spine to define a first slot oriented in a first direction and a second slot oriented in a second direction, the second direction oriented perpendicularly relative to the first direction; and
a radiused body portion depending from the attachment portion and defining an interior, the radiused body portion including a fixed end attached to the attachment portion and a free end, the free end spaced-apart from the fixed end to define an opening therebetween providing access to the interior, the free end including a flange extending therefrom, the flange angled inwardly into the interior and configured to guide insertion of cables through the opening and into the interior and to inhibit cables from exiting the interior through the opening,
wherein the interiors of the body portions of the plurality of support members cooperate to define a longitudinal passageway extending along the flexible spine in parallel orientation relative to the flexible spine.

12. The cable support apparatus according to claim 11, wherein each radiused body portion is configured to permit insertion of cables into the interior thereof while the cables are maintained in parallel orientation relative to the flexible spine.

13. The cable support apparatus according to claim 11, wherein the radiused body portions of at least two of the support members are configured to permit simultaneous insertion of cables into the interiors thereof while the cables are maintained in parallel orientation relative to the flexible spine.

14. The cable support apparatus according to claim 11, wherein the radiused body portions of the support members each define greater than a semicircle but less than a full circle.

15. The cable support apparatus according to claim 11, wherein the radiused body portions of the support members each define a helical configuration.

16. The cable support apparatus according to claim 11, wherein the attachment portion of each of the plurality of support members is secured to the flexible spine in at least two locations.

17. The cable support apparatus according to claim 11, wherein the first slot enables attachment of the cable support apparatus to a structure in a first orientation and wherein the second slot enables attachment of the cable support apparatus to a structure in a second orientation perpendicular to the first orientation.

* * * * *